US012719447B2

(12) United States Patent
Wang et al.

(10) Patent No.: US 12,719,447 B2
(45) Date of Patent: Aug. 25, 2026

(54) FILTER MODULE WITH IMPROVED LINEARITY RESPONSE

(71) Applicant: SKYWORKS SOLUTIONS, INC., Irvine, CA (US)

(72) Inventors: Yiliu Wang, Irvine, CA (US); Renfeng Jin, Irvine, CA (US); David Albert Feld, Los Altos, CA (US)

(73) Assignee: SKYWORKS SOLUTIONS, INC., Irvine, CA (US)

(*) Notice: Subject to any disclaimer, the term of this patent is extended or adjusted under 35 U.S.C. 154(b) by 335 days.

(21) Appl. No.: 18/597,127

(22) Filed: Mar. 6, 2024

(65) Prior Publication Data

US 2024/0305273 A1 Sep. 12, 2024

Related U.S. Application Data

(60) Provisional application No. 63/450,427, filed on Mar. 7, 2023.

(51) Int. Cl.

| | |
|---|---|
| ***H03H 9/56*** | (2006.01) |
| ***H03H 9/54*** | (2006.01) |
| ***H03H 9/60*** | (2006.01) |
| ***H03H 9/70*** | (2006.01) |

(52) U.S. Cl.

CPC ............ *H03H 9/566* (2013.01); *H03H 9/542* (2013.01); *H03H 9/60* (2013.01); *H03H 9/70* (2013.01); *H03H 9/703* (2013.01)

(58) Field of Classification Search

CPC ............ H03H 9/566; H03H 9/70; H03H 9/60; H03H 9/703; H03H 9/542

See application file for complete search history.

(56) References Cited

U.S. PATENT DOCUMENTS

| | | | | |
|---|---|---|---|---|
| 5,435,311 | A * | 7/1995 | Umemura | A61B 17/2256 601/3 |
| 5,893,026 | A * | 4/1999 | Kim | H03H 7/0115 455/114.1 |
| 7,630,726 | B2 * | 12/2009 | Kim | H04B 1/406 455/418 |
| 9,154,167 | B1 * | 10/2015 | Lee | H04B 1/0483 |
| 10,762,986 | B1 * | 9/2020 | Chang | A61B 5/7228 |
| 2006/0281418 | A1 * | 12/2006 | Huang | H04B 1/48 455/78 |

(Continued)

*Primary Examiner* — Dominic E Rego

(74) *Attorney, Agent, or Firm* — Lando & Anastasi, LLP

(57) ABSTRACT

Aspects and embodiments disclosed herein include filter module comprising an input port to receive a radio frequency signal, a first output port connected to an antenna, a filter disposed along a fundamental signal path from the input port to the first output port, and a second output port to output a harmonic signal generated in response to the RF signal, the second output port being electrically connected to a node on the fundamental signal path via a harmonic signal path including a resonating structure configured to improve a linearity response of the filter module, the resonating structure including resonators electrically connected to each other in anti-series or anti-parallel and disposed on a piezoelectric film, a polarity direction of a first half of the resonators opposite to a polarity direction of a second half of the resonators when a voltage is applied across the piezoelectric film.

20 Claims, 13 Drawing Sheets

(56) References Cited

U.S. PATENT DOCUMENTS

| | | | | |
|---|---|---|---|---|
| 2011/0163818 | A1* | 7/2011 | Dichtl | G06F 7/588 331/57 |
| 2011/0319123 | A1* | 12/2011 | Kwun | H04W 52/346 455/522 |
| 2012/0049945 | A1* | 3/2012 | Meguro | H01P 1/15 327/558 |
| 2016/0381648 | A1* | 12/2016 | Tanaka | H04B 7/265 370/280 |
| 2017/0063345 | A1* | 3/2017 | Anegawa | H03D 7/1466 |
| 2017/0077896 | A1* | 3/2017 | Sugaya | H03H 7/38 |
| 2017/0359050 | A1* | 12/2017 | Irieda | H03H 9/64 |
| 2018/0226941 | A1* | 8/2018 | van Liempd | H03H 7/38 |
| 2018/0246151 | A1* | 8/2018 | Fujiwara | G01R 23/14 |
| 2018/0254714 | A1* | 9/2018 | Rangel | H01P 1/2007 |
| 2019/0326785 | A1* | 10/2019 | Freitas | H02J 50/20 |
| 2020/0076032 | A1* | 3/2020 | Gavryliuk | H01P 1/20327 |
| 2020/0244231 | A1* | 7/2020 | Noto | H04B 1/04 |
| 2021/0044319 | A1* | 2/2021 | Takebe | H04B 1/50 |
| 2021/0351903 | A1* | 11/2021 | Mori | H04B 1/0057 |
| 2022/0109423 | A1* | 4/2022 | Guyette | H03H 9/564 |
| 2022/0263495 | A1 | 8/2022 | Wang et al. | |
| 2022/0294421 | A1 | 9/2022 | Wang et al. | |
| 2022/0294422 | A1 | 9/2022 | Wang et al. | |
| 2022/0294423 | A1 | 9/2022 | Wang et al. | |
| 2022/0376718 | A1* | 11/2022 | Chen | H03F 1/565 |
| 2023/0011384 | A1* | 1/2023 | Strano | A61B 90/39 |
| 2023/0238984 | A1* | 7/2023 | Tajima | H03H 9/6483 |
| 2024/0241267 | A1* | 7/2024 | Billsberry | H01Q 9/36 |
| 2024/0243729 | A1* | 7/2024 | Chen | H03H 9/568 |

* cited by examiner

| | ITEM | CONDITION | Pin(dBm) | F1(MHz) | I/P | O/P | WAVEFORM | HARMONIC Freq(MHz) | Pout(dBm) | SPEC (dBm) | COMMENT |
|---|---|---|---|---|---|---|---|---|---|---|---|
| WITH SINGLE RESONATOR | 1 | OC-1-KA274 | 25 | 787.5 | LB | GPS | CW | 1575 | -47.95 | -67 | ANT, HB=50 OHM TERM |
| | 2 | OC-2-KA274 | 25 | 787.5 | LB | GPS | CW | 1575 | -47.36 | -67 | ANT, HB=50 OHM TERM |
| WITH INTEGRATED RESONATOR | 1 | OC-1-KA369 | 25 | 787.5 | LB | GPS | CW | 1575 | -99.78 | -67 | ANT, HB=50 OHM TERM |
| | 2 | OC-2-KA369 | 25 | 787.5 | LB | GPS | CW | 1575 | -104.25 | -67 | ANT, HB=50 OHM TERM |

FIG.10

FILTER MODULE WITH IMPROVED LINEARITY RESPONSE

CROSS-REFERENCE TO RELATED APPLICATIONS

This application claims priority under 35 U.S.C. § 119(e) to U.S. Provisional Patent Application Ser. No. 63/450,427, titled "FILTER MODULE WITH IMPROVED LINEARITY RESPONSE", filed Mar. 7, 2023, the entire content of which is incorporated herein by reference for all purposes.

BACKGROUND

Field

Aspects and embodiments of the present disclosure relate to electronic systems, and in particular, to a filter module for use in radio frequency (RF) electronics.

Description of the Related Technology

Filters are used in radio frequency (RF) communication systems to allow signals to pass through at discreet frequencies and to reject any frequency outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic wave resonator filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter modules include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

In accordance with one aspect, there is provided a filter module. The filter module comprises an input port configured to receive a radio frequency (RF) signal, a first output port configured to be connected to an antenna, a filter disposed along a fundamental signal path extending from the input port to the first output port, and a second output port configured to output a harmonic signal generated in response to the RF signal, the second output port being electrically connected to a node on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

In some embodiments, the piezoelectric film is c-axis oriented film.

In some embodiments, each of the plurality of resonators of the resonating structure has a metal top electrode (MTE) and a metal bottom electrode (MBE).

In some embodiments, the polarity direction of the first half of the resonators is from the MTE to the MBE, and the polarity direction of the second half of the resonators is from the MBE to the MTE.

In some embodiments, the filter is a bandpass filter including at least one inductor and at least one capacitor without an acoustic resonator.

In some embodiments, the harmonic signal path includes an acoustic filter to detect a global positioning system (GPS) frequency.

In some embodiments, the harmonic signal path extends from the second output port at least to the first output port.

In some embodiments, the filter module further includes an additional acoustic filter disposed between a second input port and the first output port.

In some embodiments, the harmonic signal path extends toward the second input port.

In accordance with another aspect, there is provided a radio frequency (RF) module. The RF module comprises a packaging board configured to receive a plurality of components, and a filter module implemented on the packaging board, the filter module including an input port configured to receive an RF signal, a first output port configured to be connected to an antenna, a filter disposed along a fundamental signal path extending from the input port to the first output port, and a second output port configured to output a harmonic signal generated in response to the RF signal, the second output port being electrically connected to a point on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

In some embodiments, the RF module is a front-end module.

In some embodiments, the piezoelectric film is c-axis oriented film.

In some embodiments, each of the plurality of resonators of the resonating structure has a metal top electrode (MTE) and a metal bottom electrode (MBE).

In some embodiments, the polarity direction of the first half of the resonators is from the MTE to the MBE, and the polarity direction of the second half of the resonators is from the MBE to the MTE.

In some embodiments, the filter is a bandpass filter including at least one inductor and at least one capacitor without an acoustic resonator.

In some embodiments, the harmonic signal path includes an acoustic filter to detect a global positioning system (GPS) frequency.

In some embodiments, the harmonic signal path extends from the second output port at least to the first output port.

In some embodiments, the filter module further includes an additional acoustic filter disposed between a second input port and the first output port.

In some embodiments, wherein the harmonic signal path extends toward the second input port.

In accordance with another aspect, there is provided a mobile device. The mobile device comprises an antenna configured to receive a radio frequency (RF) signal, and a front end system configured to communicate with the antenna, the front end system including a filter module, the filter module including an input port configured to receive an RF signal, a first output port configured to be connected to an antenna, a filter disposed along a fundamental signal path extending from the input port to the first output port, and a second output port configured to output a harmonic signal generated in response to the RF signal, the second output port being electrically connected to a point on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

In some embodiments, the piezoelectric film is a c-axis oriented film.

In some embodiments, each of the plurality of resonators of the resonating structure has a metal top electrode (MTE) and a metal bottom electrode (MBE).

In some embodiments, the polarity direction of the first half of the resonators is from the MTE to the MBE, and the polarity direction of the second half of the resonators is from the MBE to the MTE.

In some embodiments, the filter is a bandpass filter including at least one inductor and at least one capacitor without acoustic resonator.

In some embodiments, the harmonic signal path includes an acoustic filter to detect a global positioning system (GPS) frequency.

In some embodiments, the harmonic signal path extends from the second output port at least to the first output port.

In some embodiments, the filter module further includes an additional acoustic filter disposed between a second input port and the first output port.

In some embodiments, the harmonic signal path extends toward the second input port.

BRIEF DESCRIPTION OF THE DRAWINGS

FIG. 10 is a tested result of measuring second harmonic signal of the filter module with the resonating structure in comparison with the filter module with single resonator;

DETAILED DESCRIPTION

Figure 1:
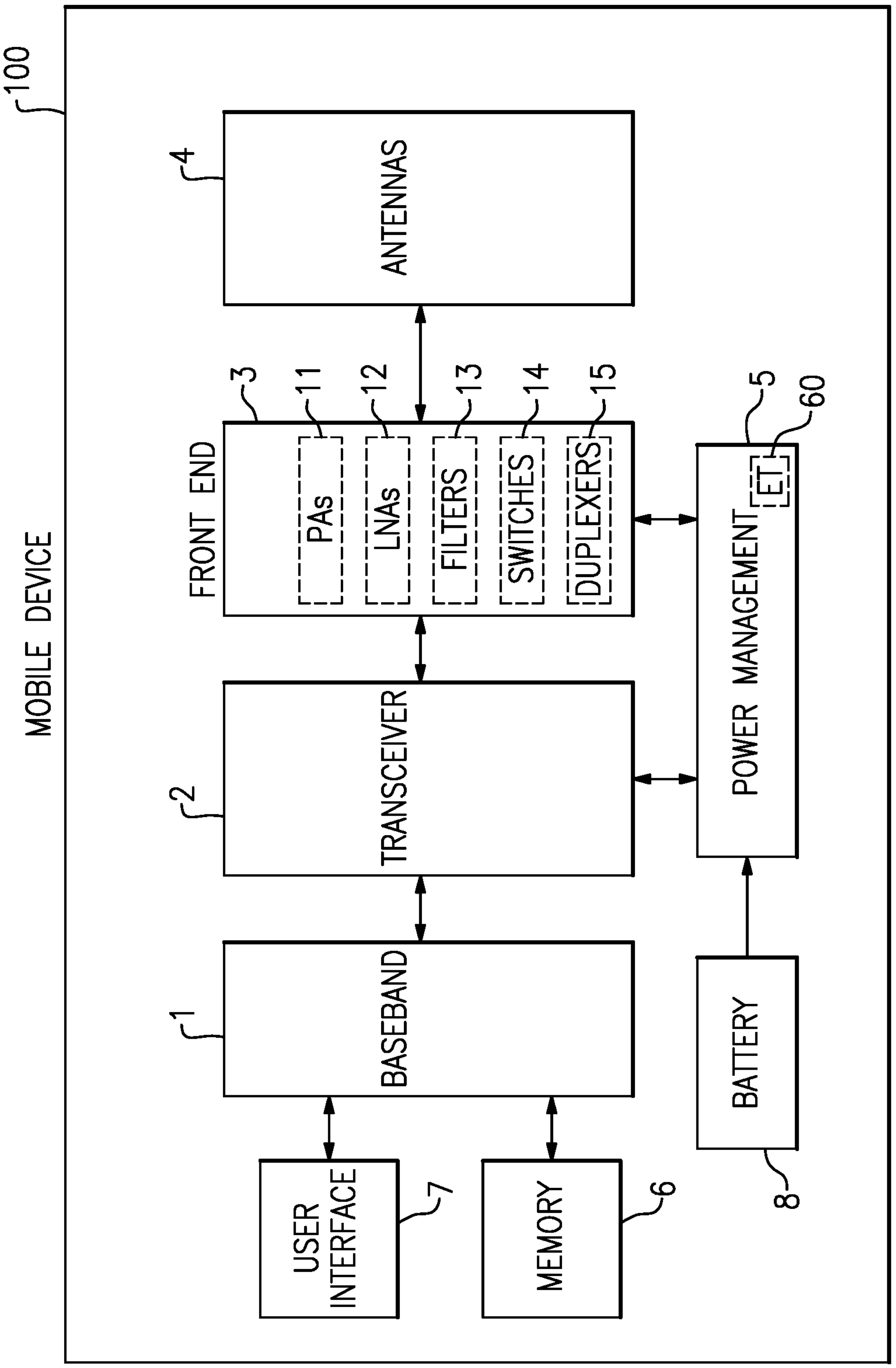
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 1, a transceiver 2, a front end system 3, antennas 4, a power management system 5, a memory 6, a user interface 7, and a battery 8.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBcc), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

The front end system 3 aids in conditioning signals transmitted to and/or received from the antennas 4. In the illustrated embodiment, the front end system 3 includes power amplifiers (PAS) 11, low noise amplifiers (LNAs) 12, filters 13, switches 14, and duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 4 can include antennas used for a wide variety of types of communications. For example, the antennas 4 can include antennas used for transmitting and/or receiving signals associated with a wide variety of frequencies and communications standards.

In certain implementations, the antennas 4 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 3 can include phase shifters having variable phase controlled by the transceiver 2. Additionally, the phase shifters are controlled to provide beam formation and directivity for transmission and/or reception of signals using the antennas 4. For example, in the context of signal transmission, the phases of the transmit signals provided to the antennas 4 are controlled such that radiated signals from the antennas 104 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 to facilitate operation of the mobile device 100.

The memory 6 can be used for a wide variety of purposes, such as storing data and/or instructions to facilitate the operation of the mobile device 100 and/or to provide storage of user information.

The power management system 5 provides a number of power management functions of the mobile device 100. The power management system 5 of FIG. 1 includes an envelope tracker 60. As shown in FIG. 1, the power management system 5 receives a battery voltage form the battery 8. The battery 8 can be any suitable battery for use in the mobile device 100, including, for example, a lithium-ion battery.

The mobile device 100 of FIG. 1 illustrates one example of an RF communication system that can include power amplifier(s) implemented in accordance with one or more features of the present disclosure. However, the teachings herein are applicable to RF communication systems implemented in a wide variety of ways.

Figure 2A:
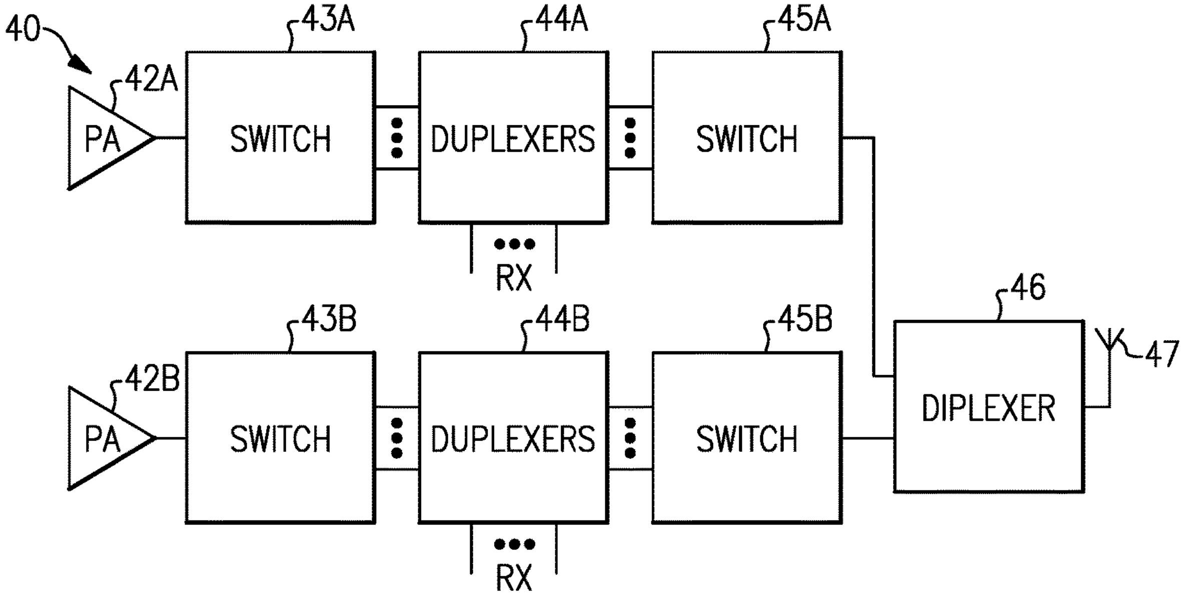
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
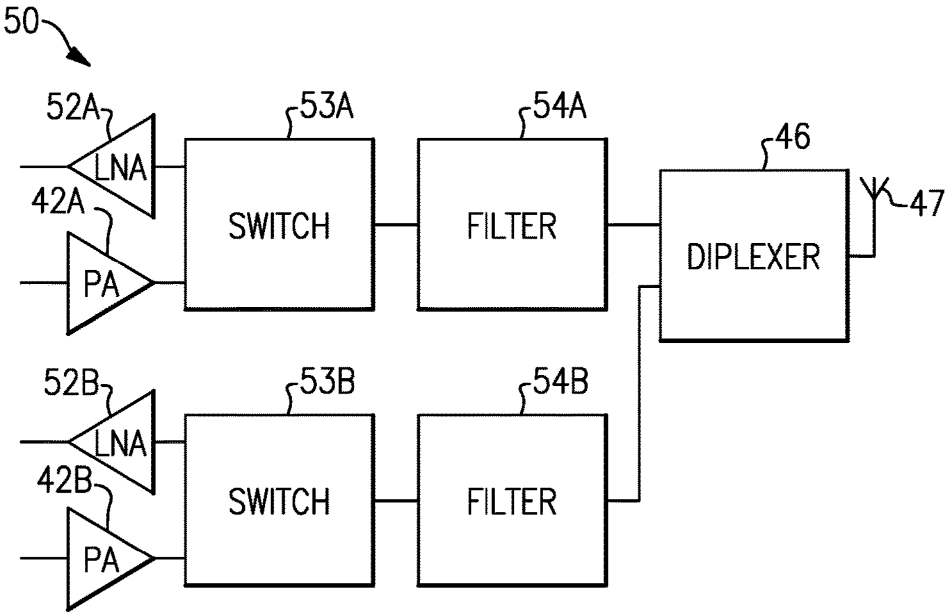
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
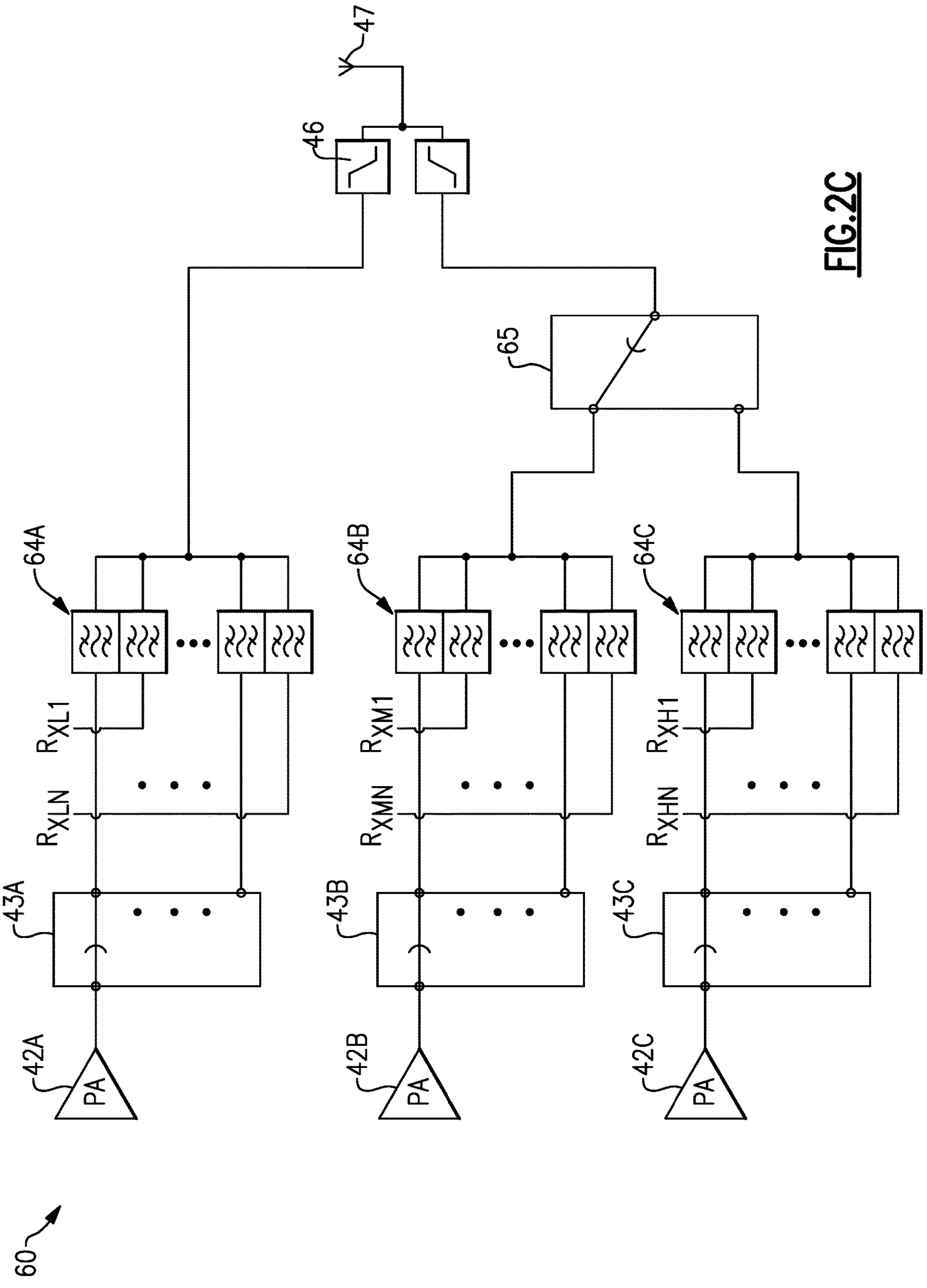
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain implementations, a low band path can process radio frequency signals having a frequency of less than 1 GHz, a medium band path can process radio frequency signals having a frequency between 1 GHz and 2.2 GHZ, and a high band path can process radio frequency signals having a frequency above 2.2 GHz.

A diplexer 46 can be included between RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
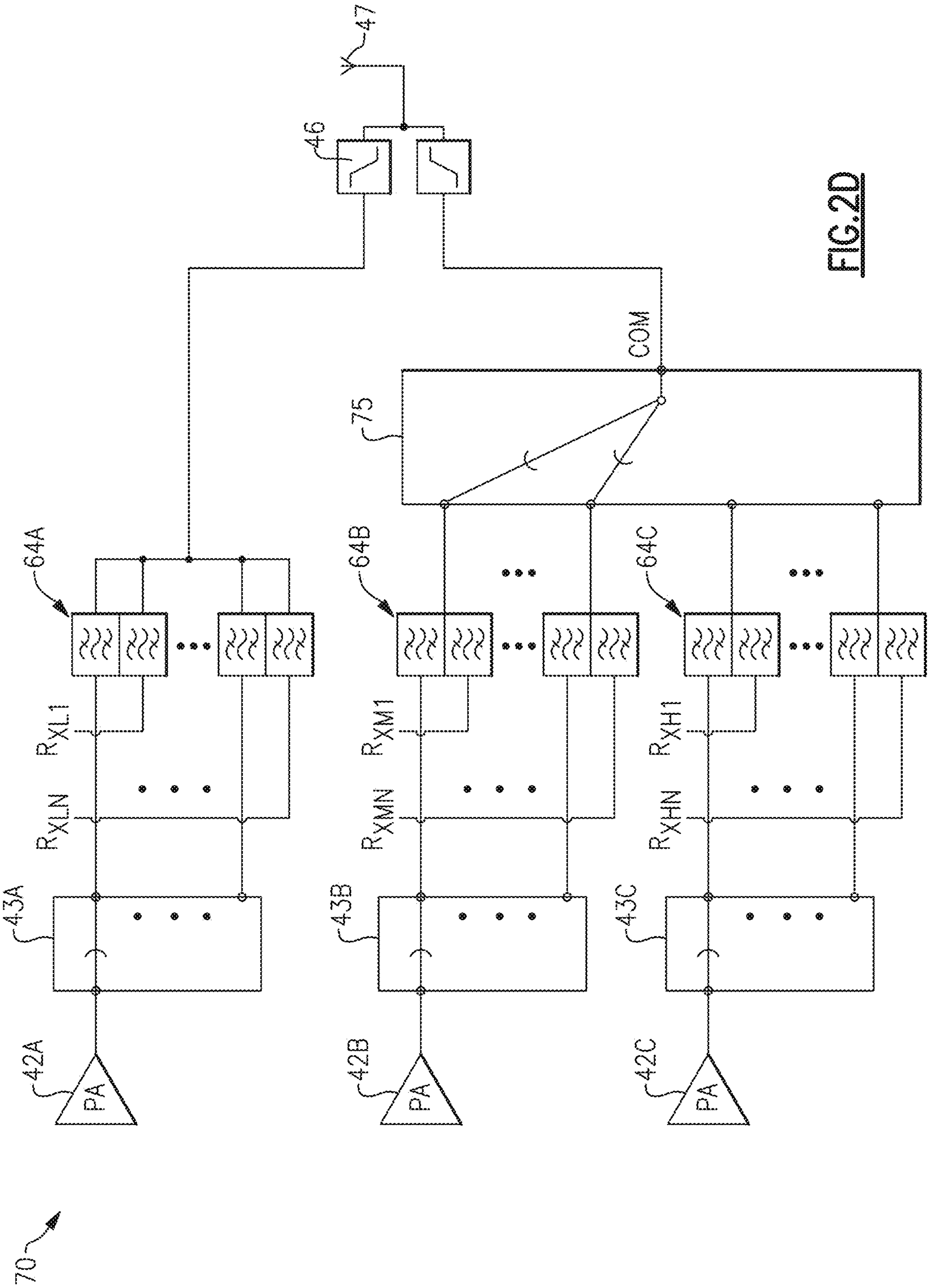
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in the multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 64B is coupled to separate throws of the switch 75. Similarly, the illustrated duplexers 64C include a plurality of duplexers coupled to separate throws of the switch 75. Alternatively, instead of duplexers being coupled to each throw of the switch 75 as illustrated in FIG. 2D, one or more individual filters of a multiplexer can be coupled to a dedicated throw of a switch coupled between the multiplexer and a common node. For instance, in some implementations, such a switch could have twice as many throws as the illustrated switch 75.

Figure 3A:
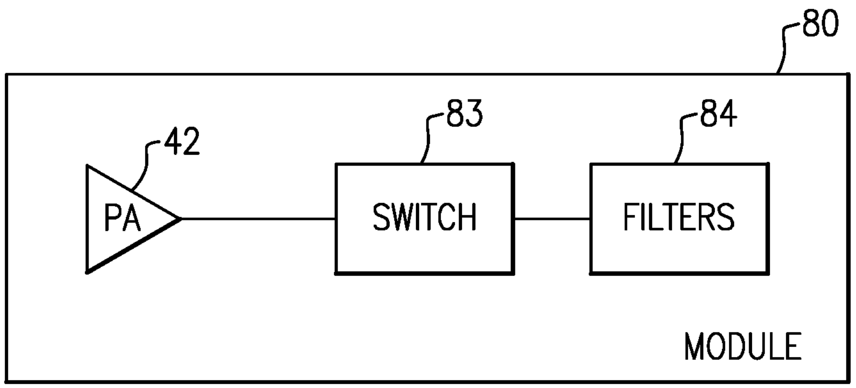
FIG. 3A is a schematic block diagram of a module that includes a filter.
Figure 3B:
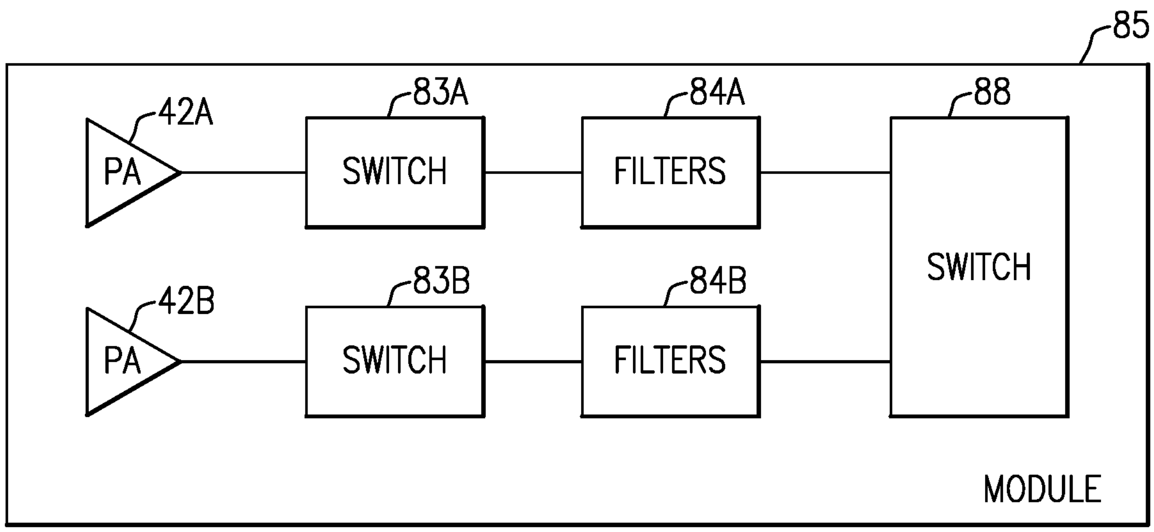
FIG. 3B is a schematic block diagram of a module that includes a filter.

The filters discussed herein can be implemented in a variety of packaged modules. Some example packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, the switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

With the introduction of 5G NR bands, linearity requirements are more stringent. Linearity issues draw more attention when a second harmonic signal is generated in the device. Second harmonic generation (SHG), also called frequency doubling, is a nonlinear optical process in which photons interacting with a nonlinear material are effectively 'combined' to form new photons having twice the frequency of initial photons. The second harmonic signal is generated by the filter itself, or by other filters connected to a filter of interest. It is known that a larger size of the device allows harmonic suppression. However, while designing the wireless device for 5G NR, one needs to consider other requirements, such as lower cost and smaller size, and it is the latter of which is very desirable for the filters.

In order to suppress the second harmonic signal, it might be suggested to add anti SE-cascade or anti SH-split resonators. In addition, it might be also suggested to add a notch filter using LC resonators, or a resonator parallel to an inductance, close to the antenna port, thereby presenting low or high impedance at double the basis frequency (f0), with minimum insertion loss (IL) at f0. Furthermore, it might be also suggested to add a notch filter in a different path connected to the path of interest, thereby presenting low or high impedance at double f0, with minimum IL at f0 frequency.

Hereinafter, a filter module with improved linearity is described according to the present disclosure.

Figure 4:
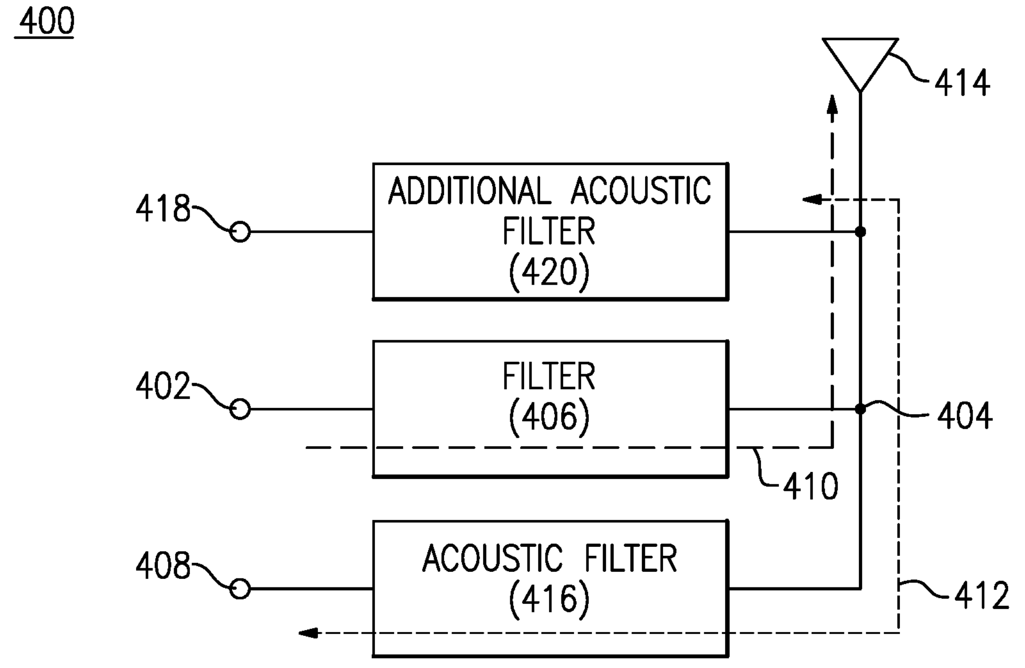
FIG. 4 is a schematic diagram of filter module.

FIG. 4 is a schematic diagram of a filter module 400 according to an embodiment of the present disclosure. As shown in FIG. 4, the filter module 400 includes an input port 402, a first output port 404, a filter 406, and a second output port 408.

The input port 402 is configured to receive a radio frequency (RF) signal. For example, the input RF signal may have a frequency in a range between 777 MHz and 798 MHz. In this description, the RF signal input to the input port 402 may be referred to as the fundamental signal.

The first output port 404 is configured to be connectable to an antenna 414. The filtered RF signal may be output through the first output port 404.

The filter 406 is disposed along a fundamental signal path 410 extending from the input terminal 402 to the first output port 404. The fundamental signal path 410 may be a signal path through which the fundamental signal passes. The fundamental signal path 410 may extend from the input terminal 402 to an antenna 414 through the first output port 404. That is, the fundamental signal path 410 may overlap at least the signal path from the input port 402 to the first output port 404.

The filter 406 may be a band-pass filter including LC elements. For example, the filter 406 may be low-band low-pass filter. According to an embodiment, the filter 406 may not include acoustic resonators.

The second output port 408 is configured to output a harmonic signal generated in response to the RF signal, i.e., the fundamental signal. The harmonic signal detected at the second output port 408 may be used for assessment of the harmonic response of the filter module 400. The harmonic signal output to the second output port 408 may be a global positioning system (GPS) frequency signal. According to an embodiment, the harmonic signal may be a second-order harmonic signal with doubled frequency of the RF signal. In this description, the harmonic signal may be also referred to as a second harmonic signal.

The second output port 408 may be electrically connected to a node on the fundamental signal path 410 via a harmonic signal path 412 through which the harmonic signal passes. That is, the harmonic signal path 412 may extend from the second output port 408 to a certain point on the fundamental signal path 410 such that the fundamental signal may cause a harmonic signal and this harmonic signal is delivered through the harmonic signal path 412. It is understood that the harmonic signal path 412 may not terminate at the certain node on the fundamental signal path, but the harmonic signal path 412 may extend beyond the node up to the second input port 418, as will be described.

The harmonic signal path 412 may include at least one resonating structure configured to improve a linearity response of the filter module 400. The linearity response improved according to embodiments of the present disclosure may be a linearity characteristic in a second harmonic response.

The resonating structure according to an embodiment may include a plurality of resonators that are electrically connected to each other in anti-series or anti-parallel. In the present disclosure, the resonators electrically connected in anti-series may be electrically connected in parallel, and the resonators connected in anti-parallel may be electrically connected in series in view of the current flows.

The resonating structure may be disposed on a piezoelectric film, so that each of the resonators is disposed on the piezoelectric film. The piezoelectric film may be a c-axis oriented film. The resonators may be arranged such that a polarity direction of a first half of the resonators is opposite to a polarity direction of a second half of the resonators when a voltage is applied across the piezoelectric film.

More specifically, each of the plurality of resonators of the resonating structure may have a metal top electrode (MTE) and a metal bottom electrode (MBE). The polarity direction of the first half of the resonators may be from the MTE to the MBE, and the polarity direction of the second half of the resonators may be from the MBE to the MTE.

According to embodiments of the present disclosure, by replacing a single resonator on the harmonic signal path 412 with the resonating structure, the non-linear (second) harmonic signal can be suppressed.

According to an embodiment, the filter module 400 may further include an acoustic filter 416 disposed between the second output port 408 and the first output port 404 to detect the GPS frequency signal. The acoustic filter 416 may be a GPS filter including acoustic resonators.

In addition, the filter module 400 may further include an additional acoustic filter 420 disposed between a second input port 418 and the first output port 404. The additional acoustic filter 420 may be a GPS notch filter including acoustic resonators.

Figure 5A:
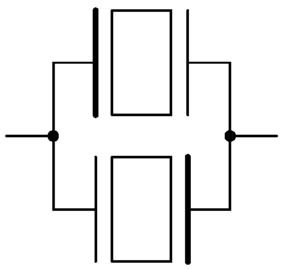
FIGS. 5A and 5B are schematic diagrams of examples of a resonating structure according to an embodiment of the present disclosure.
Figure 5B:
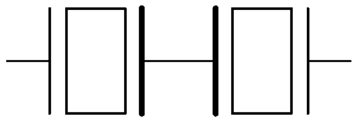

FIGS. 5A and 5B are schematic diagrams of examples of the resonating structure according to an embodiment of the present disclosure. In FIGS. 5A, 5B, the different type of electrodes are distinguished by bold lines and standard lines. Each of the different types of electrodes may be an MTE or an MBE.

In FIG. 5A, an example of anti-series resonators is illustrated. The anti-series resonators may be electrically connected to each other in parallel. The polarity direction of one resonator of the resonating structure may be opposite to the polarity direction of another resonator of the resonating structure. For example, the polarity direction of one resonator may be from MTE to MBE, and the polarity direction of the other resonator may be from MBE to MTE.

In FIG. 5B, an example of anti-parallel resonators is illustrated. The anti-parallel resonators may be electrically connected to each other in series. The polarity direction of one resonator of the resonating structure may be opposite to the polarity direction of another resonator of the resonating structure. For example, the polarity direction of one resonator may be from MTE to MBE, and the polarity direction of the other resonator may be from MBE to MTE.

Figure 6:
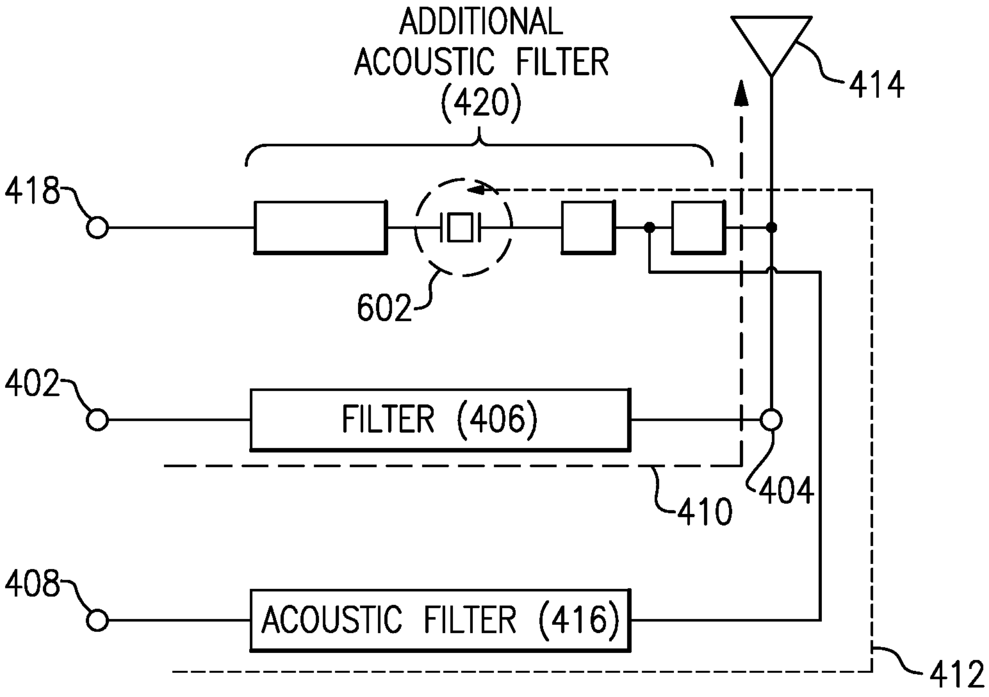
FIG. 6 is a schematic diagram of filter module with single resonator.

FIG. 6 is a schematic diagram of a conventional filter module. As shown in FIG. 6, the fundamental signal may be input to the first input port 402 and passes through the fundamental signal path 410 toward the antenna 414. In FIG. 6, each of the boxes may include any electrical elements that are configured to act as a filter.

The harmonic signal may be generated in response to the fundamental signal in the filter module and be reflected at single resonator 602. The reflected harmonic signal may be delivered through the harmonic signal path 412 to the second output port 408.

As will be described with respect to FIG. 7, the single resonator 602 may be replaced with the integrated resonator.

Figure 7:
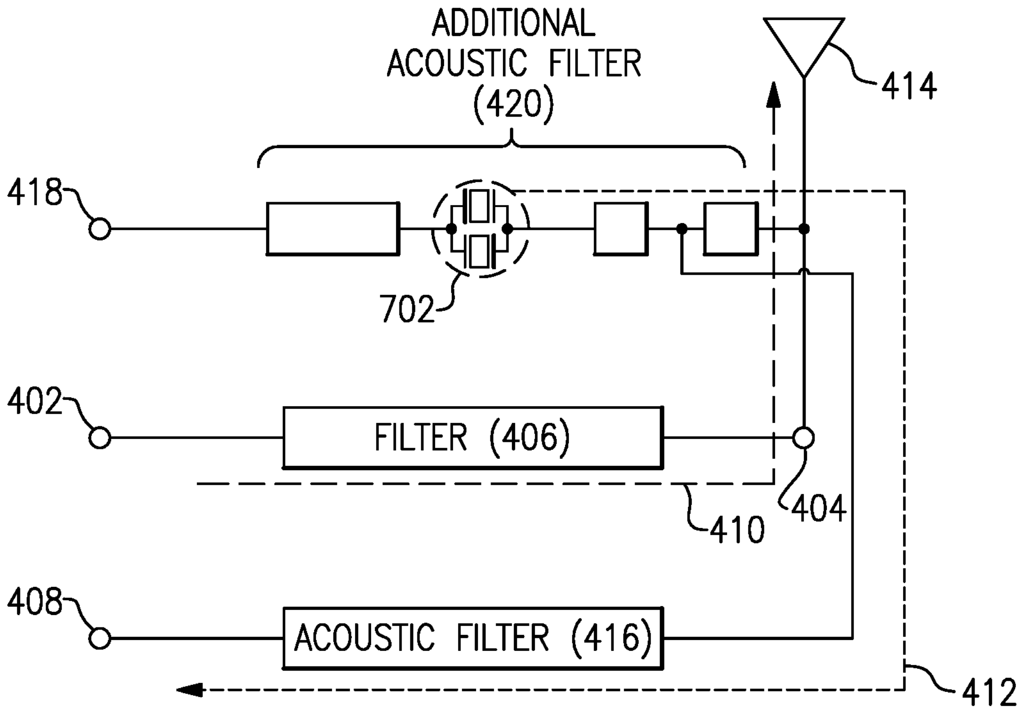
FIG. 7 is a schematic diagram of filter module with the resonating structure.

FIG. 7 is a schematic diagram of a filter module with the resonating structure 702 according to an embodiment of the present disclosure. As shown in FIG. 7, the fundamental signal may be input to the first input port 402 and passes through the fundamental signal path 410 toward the antenna 414. In FIG. 7, each of the boxes may include any electrical elements that are configured to act as a filter.

The harmonic signal may be generated in response to the fundamental signal inside the filter module and be reflected at the resonating structure 702 that replaces the single resonator 602 of FIG. 6. The reflected harmonic signal may be delivered through the harmonic signal path 412 to the second output port 408.

The resonating structure 702 may be configured to improve a linearity response of the filter module compared to a single resonator. Therefore, by replacing the single resonator 602 on the harmonic signal path 412 with the resonating structure 702, the non-linear harmonic signal can be suppressed.

Although FIG. 7 illustrates the integrated resonators with parallel resonators in opposite direction, it is understood that the series resonators can also be used as the resonating structure. Furthermore, the number of the resonators in the resonating structure is not limited thereto.

Figure 8:
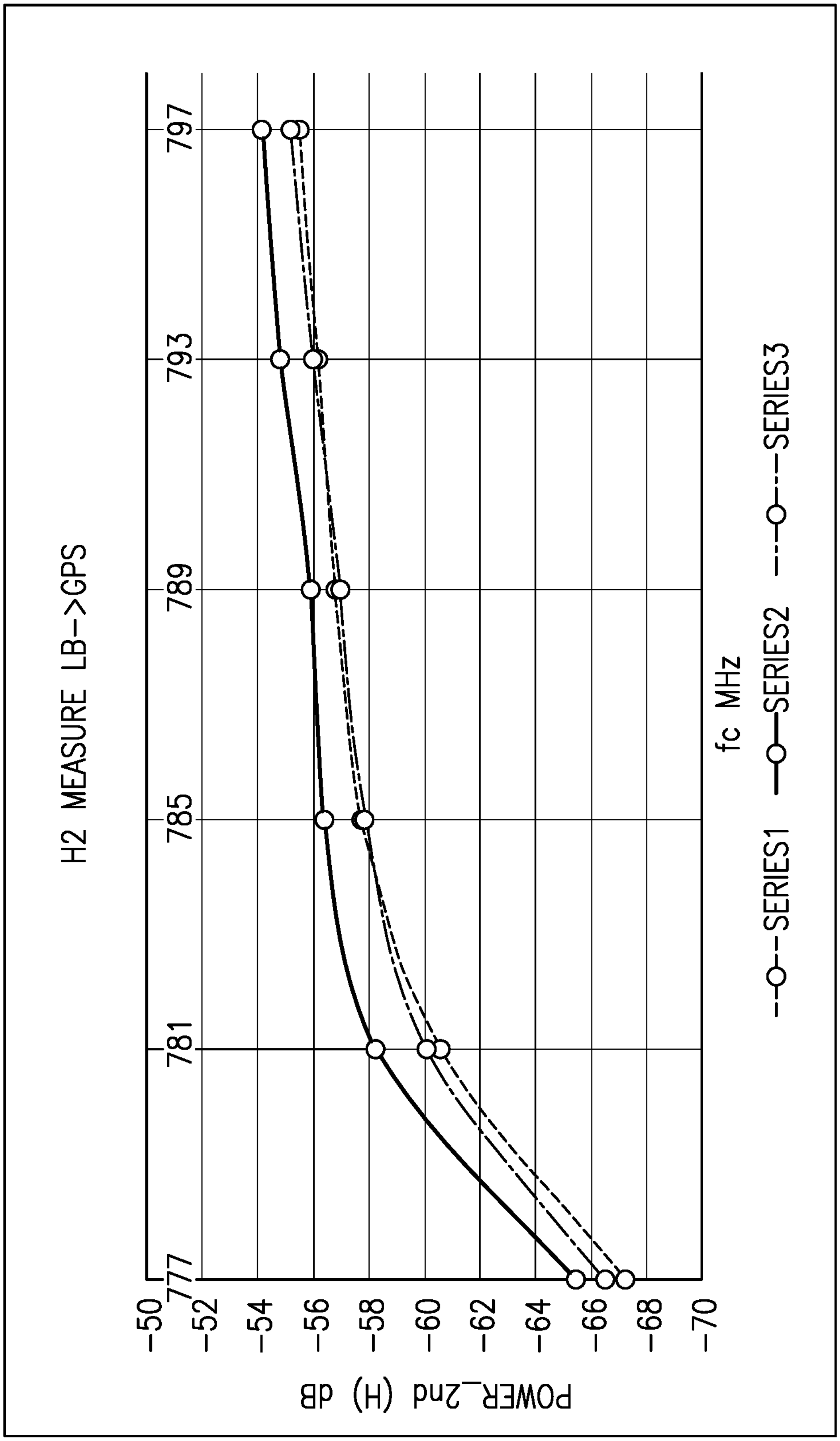
FIG. 8 is a simulated result of measuring second harmonic (H2) signal.

FIG. 8 shows a measured result measuring the second harmonic (H2) signal over frequency with a conventional filter module, such as that shown in FIG. 6. In FIG. 8, 3 different resonators of identical structure are used and measured.

Figure 9:
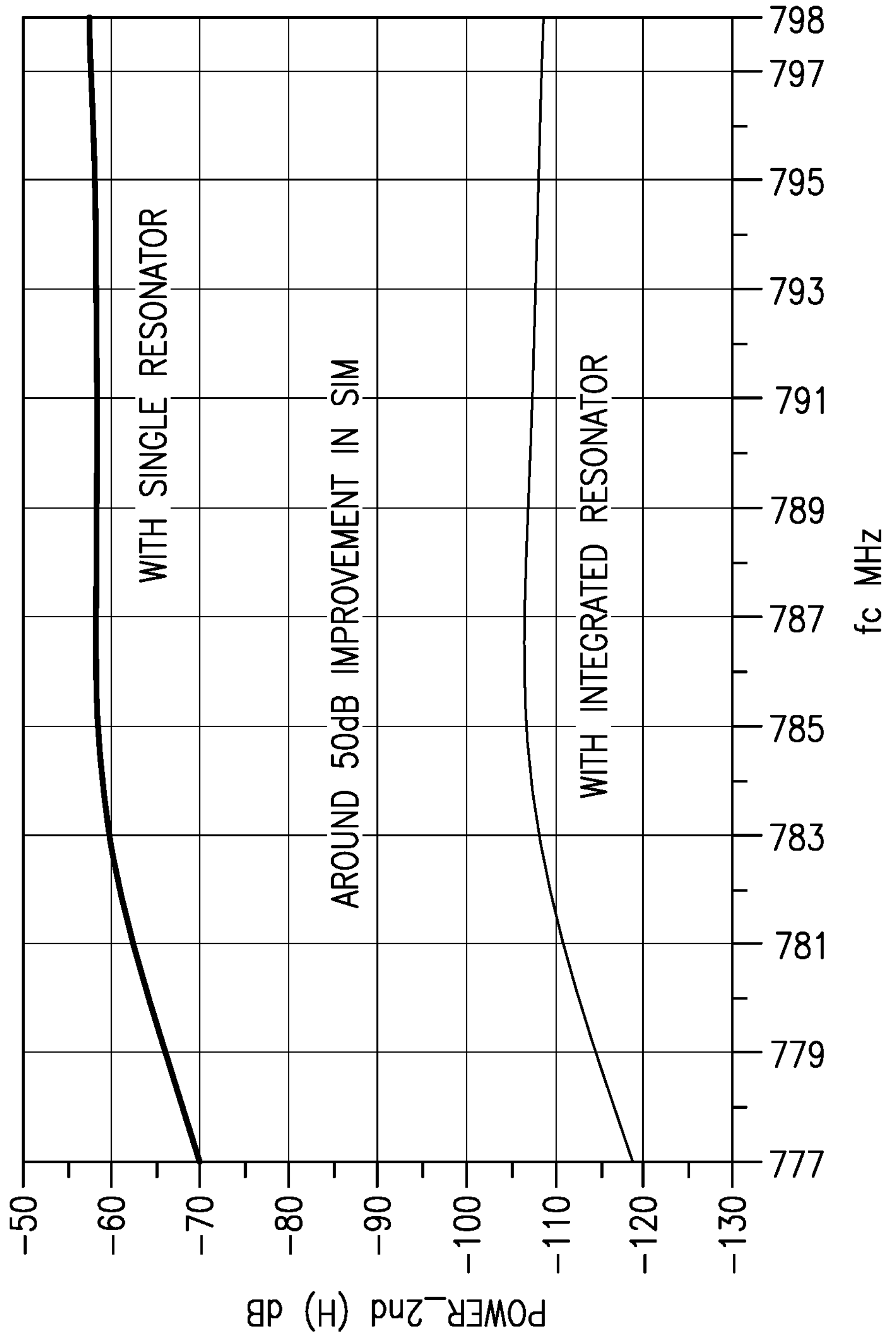
FIG. 9 is a simulated result of measuring second harmonic signal of the filter module with the resonating structure in comparison with filter module with single resonator.

FIG. 9 shows a simulated result of measuring the H2 signal of the filter module with an integrated resonator such as that shown in FIG. 7 in comparison with the conventional filter module with a single resonator as shown in FIG. 6. As shown in FIG. 9, the filter module with an integrated resonator provides a 50 dB improvement.

FIG. 10 shows test results of measuring the H2 signal of the filter module with an integrated resonator in comparison with the conventional filter module with a single resonator. As shown in FIG. 10, the output power (in dB) of the H2 signal of the filter module according to the present disclosure is improved by 50 dB over the conventional filter module.

Figure 11A:
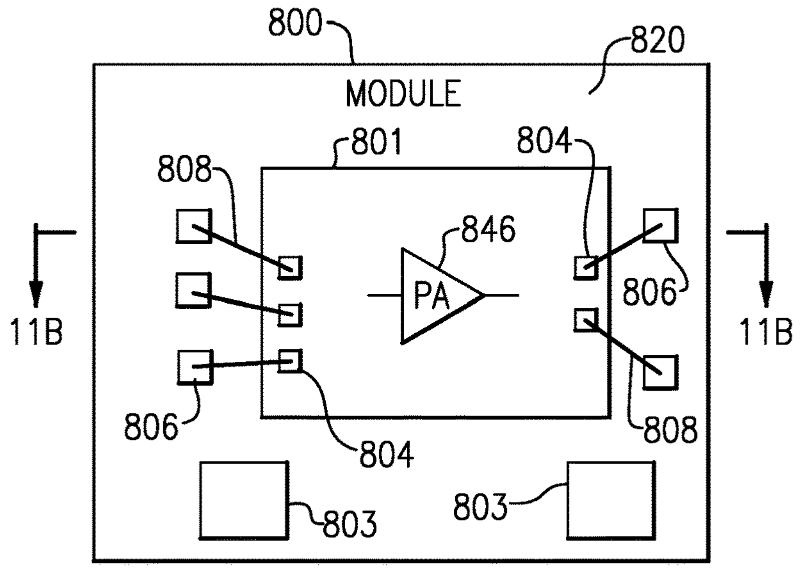
FIG. 11A is a schematic diagram of one embodiment of a packaged module.

FIG. 11A is a schematic diagram of one embodiment of a packaged module 800.

Figure 11B:
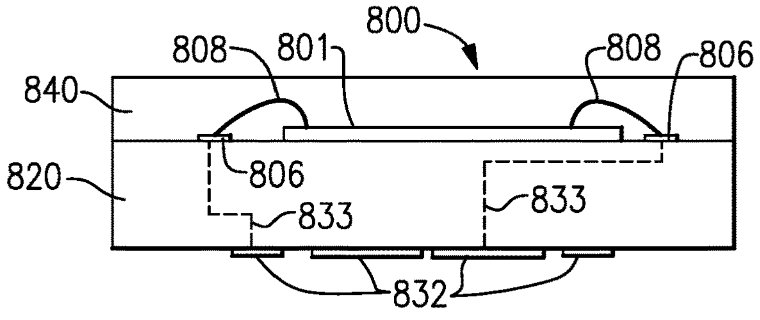
FIG. 11B is a schematic diagram of a cross-section of the packaged module of FIG. 11A taken along the lines 11B-11B.

FIG. 11B is a schematic diagram of a cross-section of the packaged module 800 of FIG. 11A taken along the lines 11B-11B.

The packaged module 800 includes an IC or die 801, surface mount components 803, wirebonds 808, a package substrate 820, and encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 801.

The die 801 includes a power amplifier 846, which can be implemented in accordance with any of the embodiments herein.

The packaging substrate 820 can be configured to receive a plurality of components such as the die 801 and the surface mount components 803, which can include, for example, surface mount capacitors and/or inductors.

As shown in FIG. 11B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 11B, the electrical connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 12:
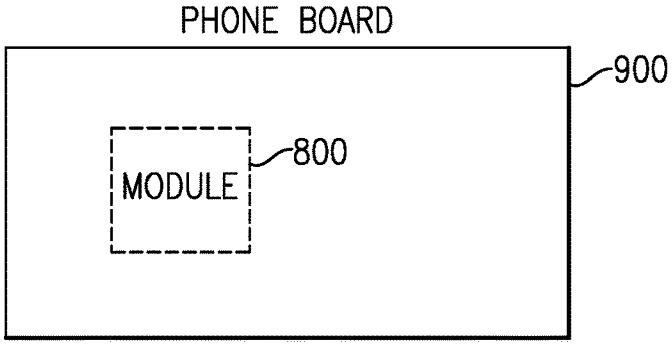
FIG. 12 is a schematic diagram of one embodiment of a phone board.

FIG. 12 is a schematic diagram of one embodiment of a phone board 900. The phone board 900 includes the module 800 shown in FIGS. 11A-11B attached thereto. Although not illustrated in FIG. 12 for clarity, the phone board 900 can include additional components and structures.

Applications

Some of the embodiments described above have provided examples in connection with wireless devices or mobile phones. However, the principles and advantages of the embodiments can be used for any other systems or apparatus that have needs for power amplifiers.

Such filter modules can be implemented in various electronic devices. Examples of electronic devices can include, but are not limited to, consumer electronic products, parts of the consumer electronic products, electronic test equipment, etc. Examples of electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A filter module comprising:
- an input port configured to receive a radio frequency (RF) signal;
- a first output port configured to be connected to an antenna;
- a filter disposed along a fundamental signal path extending from the input port to the first output port; and
- a second output port configured to output a harmonic signal generated in response to the RF signal, the second output port being electrically connected to a node on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

2. The filter module of claim 1 wherein the piezoelectric film is c-axis oriented film.

3. The filter module of claim 1 wherein each of the plurality of resonators of the resonating structure has a metal top electrode (MTE) and a metal bottom electrode (MBE).

4. The filter module of claim 3 wherein the polarity direction of the first half of the resonators is from the MTE to the MBE, and the polarity direction of the second half of the resonators is from the MBE to the MTE.

5. The filter module of claim 1 wherein the filter is a bandpass filter including at least one inductor and at least one capacitor without an acoustic resonator.

6. The filter module of claim 1 wherein the harmonic signal path includes an acoustic filter to detect a global positioning system (GPS) frequency.

7. The filter module of claim 1 wherein the harmonic signal path extends from the second output port at least to the first output port.

8. The filter module of claim 7 wherein the filter module further includes an additional acoustic filter disposed between a second input port and the first output port.

9. The filter module of claim 8 wherein the harmonic signal path extends toward the second input port.

10. A radio frequency (RF) module comprising:
- a packaging board configured to receive a plurality of components; and a filter module implemented on the packaging board, the filter module including an input port configured to receive an RF signal, a first output port configured to be connected to an antenna, a filter disposed along a fundamental signal path extending from the input port to the first output port, and a second output port configured to output a harmonic signal generated in response to the RF signal, the second output port being electrically connected to a point on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

11. The RF module of claim 10 wherein the RF module is a front-end module.

12. The RF module of claim 10 wherein the piezoelectric film is c-axis oriented film.

13. The RF module of claim 12 wherein the filter is a bandpass filter including at least one inductor and at least one capacitor without an acoustic resonator.

14. The RF module of claim 12 wherein the harmonic signal path includes an acoustic filter to detect a global positioning system (GPS) frequency.

15. The RF module of claim 12 wherein the harmonic signal path extends from the second output port at least to the first output port.

16. The RF module of claim 15 wherein the filter module further includes an additional acoustic filter disposed between a second input port and the first output port.

17. The RF module of claim 16 wherein the harmonic signal path extends toward the second input port.

18. The RF module of claim 10 wherein each of the plurality of resonators of the resonating structure has a metal top electrode (MTE) and a metal bottom electrode (MBE).

19. The RF module of claim 18 wherein the polarity direction of the first half of the resonators is from the MTE to the MBE, and the polarity direction of the second half of the resonators is from the MBE to the MTE.

20. A mobile device comprising:

an antenna configured to receive a radio frequency (RF) signal; and a front end system configured to communicate with the antenna, the front end system including a filter module, the filter module including an input port configured to receive an RF signal, a first output port configured to be connected to an antenna, a filter disposed along a fundamental signal path extending from the input port to the first output port, and a second output port configured to output a harmonic signal generated in response to the RF signal, the second output port being electrically connected to a point on the fundamental signal path via a harmonic signal path through which the harmonic signal passes, the harmonic signal path including at least one resonating structure configured to improve a linearity response of the filter module, the at least one resonating structure including a plurality of resonators that are electrically connected to each other in anti-series or anti-parallel and disposed on a piezoelectric film, the resonators arranged such that a polarity direction of a first half of the resonators is opposite to a polarity direction of a second half of the resonators when a voltage is applied across the piezoelectric film.

* * * * *